United States Patent [19]
Smayling et al.

[11] Patent Number: 5,911,104
[45] Date of Patent: Jun. 8, 1999

[54] INTEGRATED CIRCUIT COMBINING HIGH FREQUENCY BIPOLAR AND HIGH POWER CMOS TRANSISTORS

[75] Inventors: Michael C. Smayling, Missouri City; Ronald N. Parker, Houston; Manuel L. Torreno, Jr., deceased, late of Houston, all of Tex., by Arlene K. Torreno, legal representative

[73] Assignee: Texas Instruments Incorporated, Dallas, Tex.

[21] Appl. No.: 09/027,369

[22] Filed: Feb. 20, 1998

[51] Int. Cl.⁶ .................................... H01L 29/12
[52] U.S. Cl. .................. 438/202; 438/234; 438/268; 438/275
[58] Field of Search ................... 438/234, 268, 438/275, 286, 307, 202; 257/335, 337, 338

[56] References Cited

U.S. PATENT DOCUMENTS

| | | | |
|---|---|---|---|
| 4,546,370 | 10/1985 | Curran | 257/370 |
| 4,705,759 | 11/1987 | Lidow et al. | 438/268 |
| 4,914,047 | 4/1990 | Seki | 438/306 |
| 5,045,902 | 9/1991 | Bancal | 438/275 |
| 5,047,358 | 9/1991 | Kosiak et al. | 438/228 |
| 5,179,036 | 1/1993 | Matsumoto | 438/203 |
| 5,242,841 | 9/1993 | Smayling et al. | 438/268 |
| 5,348,895 | 9/1994 | Smayling et al. | 438/268 |
| 5,491,105 | 2/1996 | Smayling et al. | 438/268 |

FOREIGN PATENT DOCUMENTS

| | | | |
|---|---|---|---|
| 2257296 | 1/1993 | United Kingdom | 27/6 |

*Primary Examiner*—Olik Chaudhuri
*Assistant Examiner*—Michael Dietrich
*Attorney, Agent, or Firm*—Gerald E. Laws; Robert D. Marshall, Jr.; Richard L. Donaldson

[57] ABSTRACT

A process flow which can be used to fabricate a high frequency bipolar transistor 147, a power transistor 146, and non-power MOS devices on a single substrate while maintaining superior performance. The process flow forms an initial high-voltage tank 170 in substrate 150. A thin epitaxial layer 156 is formed on the substrate which overlies the initial high voltage tank and Diffusion Under Film, DUF, region 154. The high voltage tank is extended through the epitaxial layer and power transistor 146 is formed in the high voltage tank and high frequency bipolar transistor 147 is formed in the epitaxial layer using the DUF region as a deep collector. Other types of low voltage devices 139 and 140 and mid voltage devices 141–145 and 148–149 are formed unaffected by the presence of epitaxial layer 156. A single chip transmitter 400 and a single chip receiver 410 is fabricated with high frequency transistors and power devices. A single chip disk controller 460 is fabricated with high frequency transistors and power devices.

19 Claims, 14 Drawing Sheets

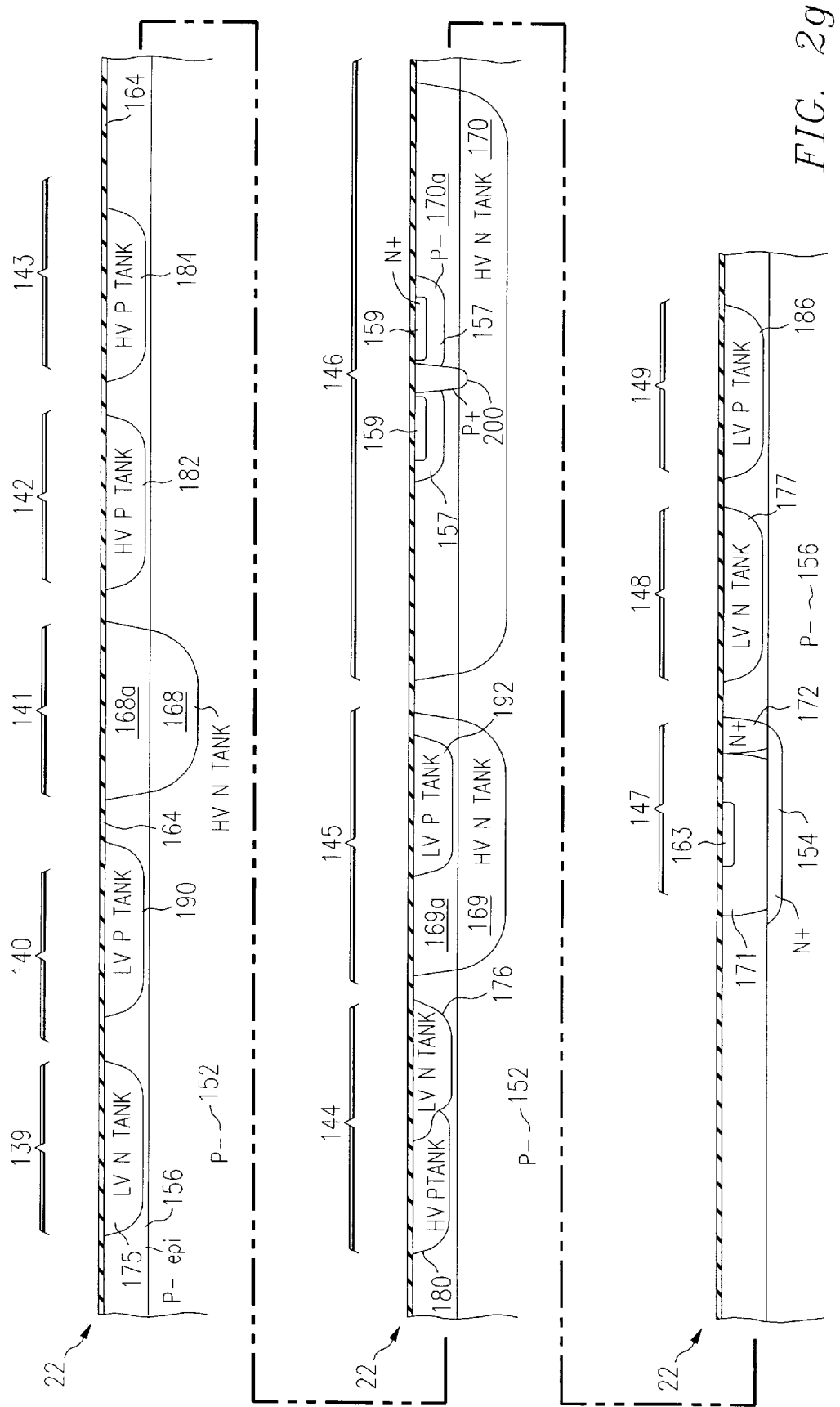

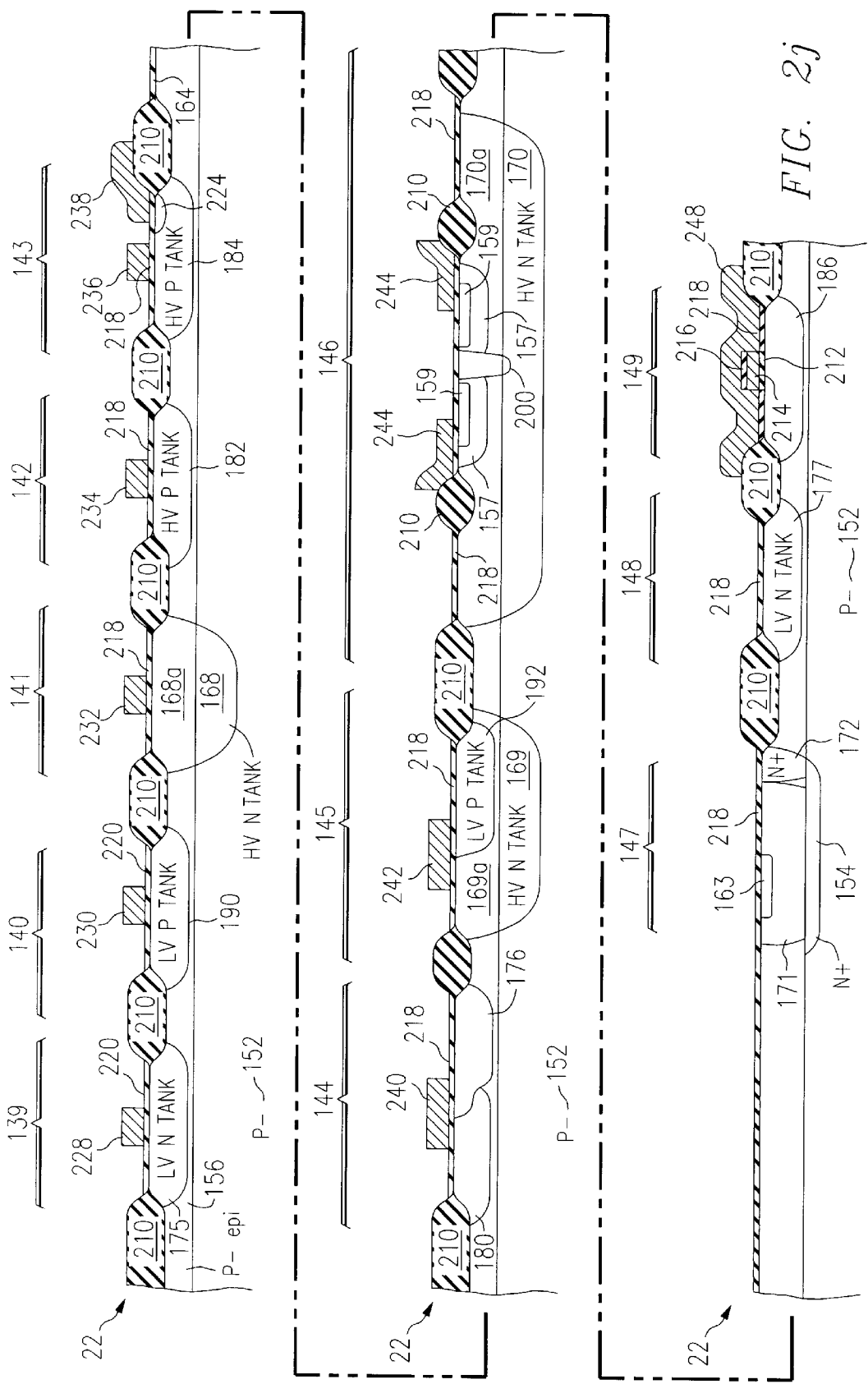

INTEGRATED CIRCUIT COMBINING HIGH FREQUENCY BIPOLAR AND HIGH POWER CMOS TRANSISTORS

CROSS-REFERENCE TO RELATED APPLICATIONS

The following patents are hereby incorporated herein by reference:

| Patent No | Issue Date | |
|---|---|---|
| 5,242,841 | 9/07/93 | Method of Making LDMOS Transistor with Self-Aligned Source/Backgate and Photo-Aligned Gate |
| 5,348,895 | 9/24/94 | LDMOS Transistor with Self-Aligned Source/-Backgate and Photo-Aligned Gate |

TECHNICAL FIELD OF THE INVENTION

The present invention is in the field of semiconductor processing.

BACKGROUND OF THE INVENTION

In many applications it is desirable to have a variety of logic devices, memory devices, high frequency devices and devices capable of withstanding large transients (hereon referred to as power devices) all on a single substrate. One such type of power device is a double-diffused metal-oxide-semiconductor transistor (DMOS).

Heretofore typical high voltage processes do not support high performance bipolar transistors, which require a thin epitaxial layer and a buried layer. Long high temperature anneal steps required for typical high voltage processes are not compatible with buried layers under a thin epitaxial layer.

It is, therefore, an object of the invention to form high performance bipolar transistors in combination with high voltage DMOS transistors. It is a further object of the invention to perform a majority of the high-temperature process early in the process flow. Further objects and advantages of the invention will become apparent to those of ordinary skill in the art having reference to the following specification together with the drawings.

SUMMARY OF THE INVENTION

One aspect of the present invention is a process flow which can be used to fabricate high frequency bipolar transistors, power and non-power MOS devices on a single substrate while maintaining superior performance. More specifically, the process flow of the present invention was created to enhance the performance of the high frequency devices, and at the same time reduce the number of process steps by incorporating the process steps used to enhance the performance of the high frequency devices to fabricate power and other non-power devices, without degrading their performance. Another aspect of the present invention is a process used to fabricate power devices and non-power devices in which the channel length of the devices is defined by the different diffusion rates of the dopants used to form the channel and surrounding tank structures.

An embodiment of the present invention is a method of forming an integrated circuit on a semiconductor substrate. The method comprises the steps of: introducing a dopant of a first conductivity type into the substrate which has a second conductivity type; annealing the dopant to form an initial high-voltage tank; forming a thin epitaxial layer of the same conductivity type as the substrate on the upper surface of the substrate so that the thin epitaxial layer overlies the tank; forming an extended tank by introducing a dopant of the first conductivity type into the epitaxial layer directly above the initial high-voltage tank so that a high-voltage tank comprising said initial high-voltage tank and said extended tank is formed which extends through the epitaxial layer and has an approximately uniform dopant distribution; and forming a power device in the high voltage tank.

Another embodiment of the present invention further comprises the steps of: introducing a dopant of the first conductivity type into the substrate to form a Diffusion Under Film, DUF, region of good conductivity such that the DUF region is between the substrate and the thin epitaxial layer; and forming a high frequency bipolar device in the thin epitaxial layer in conjunction with said DUF region, in a manner that the high frequency characteristics of the bipolar device are enhanced by the thinness of said epitaxial layer.

Another embodiment of the present invention further comprises the steps of: introducing dopants of the first conductivity type and the second conductivity type in a region in the high-voltage tank; annealing the dopants of the first and the second conductivity type to form a second region within a third region, both within the high-voltage tank, due to the different rates of diffusion of the dopants; forming a gate structure which overlaps the third region; forming a thick field oxide in the high voltage tank; and forming a drain region in the high voltage tank adjacent to the thick field oxide.

Another embodiment of the present invention further comprises the steps of: introducing a dopant of the first conductivity type into the epitaxial layer to form a collector region that extends through the epitaxial layer and connects to the DUF region; forming an emitter region and a base region in the collector region; and forming a contact region of good conductivity through the epitaxial layer.

Another embodiment of the present invention is an integrated circuit comprising a high frequency transistor, a power transistor, and one or more of the following devices: a sub micron CMOS device, an EEPROM device, an EPROM device, a high voltage CMOS device, a tunneling diode, or a Schottky diode.

Another embodiment of the present invention is a single chip communications receiver for controlling a device, comprising: high frequency means for receiving and demodulating a radio frequency signal so that control instructions can be recovered from the radio frequency signal; means for uniquely identifying the communication receiver as the intended destination of the radio frequency signal; means for decoding the control instructions to form control signals; and high power means for switching an externally supplied voltage of up to 60 volts, whereby the device is controlled in response to the control instructions.

Another embodiment of the present invention is a single chip disk controller, comprising: means for receiving commands to read or write externally supplied data onto a disk; high power means for directly controlling an external servo so that a read/write head is positioned over a track in response to the received commands; high frequency means for receiving and amplifying a high frequency signal directly from the disk read head; high frequency means for decoding the amplified read head signal so that the data stored on the disk can be recovered; means for encoding write data to be written onto the disk; means for providing the encoded write data directly to the disk write head; and means for exchanging data that is to be written to the disk or read from the disk with an external data processing system.

BRIEF DESCRIPTION OF THE DRAWINGS

The present invention is described in conjunction with the accompanying drawings, in which:

FIGS. 2a–2k are highly magnified sectional views of different portions of an integrated circuit manufactured in accordance with the process flow of FIG. 1, showing successive stages in the fabrication thereof;

DETAILED DESCRIPTION OF THE PREFERRED EMBODIMENT

Integrated Process

Figure 1:
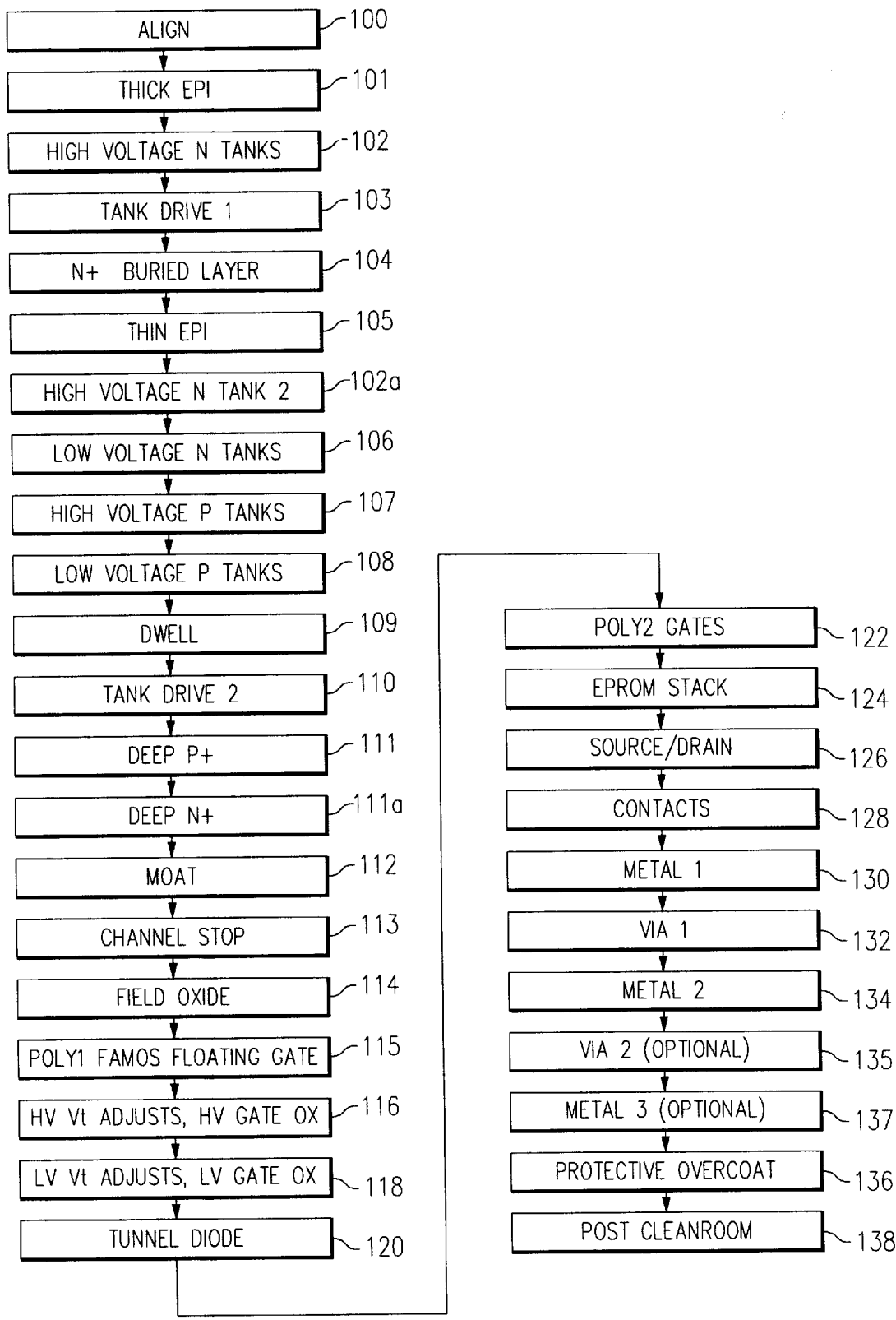
FIG. 1 is a high level semiconductor process flow diagram.

FIG. 1 is a process flowchart that gives an overview of a novel process used in fabricating an integrated circuit, according to the present invention. Before discussing specific steps of the process, some of its advantages are described.

Among the advantages provided, the process shown in FIG. 1 is modular: where particular devices are not required, some of the process steps shown in FIG. 1 may be omitted. For example, if an integrated circuit does not require EEPROM cells, then a tunnel diode step 120 would be left out. If the device does not require FAMOS EPROM cells, a FAMOS floating gate step 115 and a EPROM stack step 124 may be omitted. Additions to the process can be made as well for modifications of illustrated cells, as will be explained hereafter.

In addition to the modular nature of the process shown in FIG. 1, it also includes process steps at the beginning of the process flow which are typically performed at the end of the process flow. An advantage of this is that key parameters of the invention, such as channel length, are defined by the diffusion rate of the dopants and not by the placement of the tank with respect to a specific structure.

The inventive process provides a unified set of process parameters that can be applied to distinctly different devices. This allows design rules for the different devices to be stored in a library. An integrated circuit designer may select different devices from this library with the assurance that a process is available for building them, and that the devices so selected are compatible with this process. This considerably reduces design time for chips having new designs.

The semiconductor process flow of FIG. 1 additionally allows both power devices, devices typically supplied with unregulated power supplies and capable of withstanding transients as high as 60 volts, and non-power devices, devices typically subjected to lower transients, to be fabricated on the same semiconductor chip with a minimum number of process steps and a minimum number of masks. The process flow is arranged to provide minimum amounts of heat cycling to each of the completed devices on the chip. By placing high temperature steps generally at the beginning of the process, later formed device structures are less likely to be damaged.

Turning now to a description of the process, it is to be noted that while the inventive process of FIG. 1 is described in conjunction with the fabrication of devices in a (p) type silicon substrate and epitaxial layers, the process has application to (n) type semiconductor materials and to other semiconductors. Since the process provides a unified set of process parameters that can be applied to distinctly different devices, the overall process is first discussed generically without reference to making a specific device. Table 1, described later, and the cross-sectional FIGS. 2a–2k relate the process to specific device types.

In FIG. 1, alignment marks are formed by etching targets into the a p-type semiconductor substrate in ALIGN step 100. The alignment marks define regions within the semiconductor substrate where device types may be formed, and are preferably used to align most of the masks used to form high-voltage and low-voltage tanks. For example, the alignment marks may designate low power CMOS regions and high power LDMOS regions. Next, process step 101 forms a thick (p–) epitaxial silicon layer of a thickness suitable to allow subsequent thermal processing. The thick epitaxial layer is typically 27 microns (27,000 nm), but this dimension is not critical with regard to the present invention. This combination of semiconductor substrate and thick p– epitaxial layer is referred to as the "semiconductor substrate" in the rest of this disclosure.

Step 102 fabricates (n–) initial tanks for the high voltage power transistors. The high voltage tanks are completed in step 102a. These tanks are large diffused regions in which the power transistors are fabricated. One technical advantage of the invention is that the same implantation used to create the high-voltage tanks for the power transistors are used to create tanks for other devices, such as n-channel 18-volt EEPROM gating transistors. Forming the power transistors in tanks isolates the sources from the substrate, allowing high-side driver circuit configurations. A high side driver configuration consists of the LDMOS transistor drain coupled to circuitry or a power supply and the source coupled to an output load.

The (n–) high voltage tank implants are diffused at high temperature in TANK DRIVE step 103. The diffusion is typically 1200° C. for 700 minutes. The temperature and length of time of diffusions done early in the process are modified somewhat depending on the temperature and length of time of diffusions done later in the process; however, the later diffusions are all cooler and shorter.

At step 104, an (n+) buried layer is selectively formed in the p– type epitaxial layer. The n+ buried layer may be used as the collector for a vertical npn bipolar transistor, as will be later described. A laterally separate n+ layer may be created for each bipolar transistor, or one such layer may be used for several such transistors if these are intended to be connected in parallel.

The n+ buried layer is "buried" in step 105 by a layer of epitaxial (p–) silicon of a thickness suitable for high frequency transistors. This layer is typically 1.5 microns (1500 nm) thick and is formed so that it is single crystal silicon matched to the silicon latice of the underlying semiconductor substrate. Thus, there is essentially no barrier at the epitaxial interface and later implants and diffusions can be performed unaffected by the presence of the epitaxial layer. The buried layer thus formed is referred to as a Diffusion Under Film, DUF. This is a key aspect of the present invention; the DUF is optimized for high frequency transistors and is formed after the high temperature tank drive of step 103, which would otherwise destroy the DUF. An additional benefit is that the remaining processing steps are not affected by the presence of the thin epitaxial layer.

Another key aspect of the invention is performed in step 102a. The initial high voltage tanks formed in step 102 are extended through the thin epitaxial layer by an additional implant that may use the same mask as used in step 102. After being diffused in step 110, the initial high voltage tank and the extended portion of the high voltage tank form a single, homogenous high voltage tank.

At step 106, low-voltage device (n−) tanks are created to enclose conventional low-voltage ($V_{dd} \leq 14$ volts) logic field effect transistors, high frequency bipolar transistors, and components of, for example, lateral DMOS n-channel power transistors and drain-extended n-channel power transistors. Low-voltage n-tanks are also used to enclose Schottky diodes. The high and low-voltage tanks described herein differ in the dopant concentrations used to create them, and are thus implanted into the chip at different times. The high voltage tanks are formed with a lower dopant concentration to preserve a high pn junction diode breakdown, but are deeper. The low-voltage tanks are shallower, but have a higher concentration of dopant.

The low voltage n-tanks are formed in the thin epitaxial layer, but as discussed earlier, they may extend into the substrate after being diffused in step 110. Low voltage n-tanks for the high frequency transistors are formed directly above the DUF regions, and after being diffused in step 110, extend down and contact the DUF region.

At step 107, a plurality of high-voltage p-tanks are created in the thin epitaxial layer. The high-voltage p-tanks are used as tanks for devices such as 18 volt EEPROM gating transistors, EEPROM cells, and drain extended n-channel transistors. Step 108 involves the fabrication of low-voltage p-tanks as, for example, the base region of high frequency bipolar transistors of the present invention, enclosures for low-voltage n-channel field effect logic transistors, as drains for extended drain p-channel field effect transistors, and as tanks for floating gate avalanche injection electrically programmable read-only memory (FAMOS EPROM) cells.

At step 109, one or more Double Diffused Well, D-well, regions are masked and implanted to form self-aligned (p−) and (n+) diffusions. The (p−) portion of the D-well is preferably formed by implanting boron into the exposed portion of the epitaxial layer, and the (n+) portion of the D-well is preferably formed by implanting arsenic into the same exposed portion of the epitaxial layer. The mask used to define the D-well regions is preferably aligned using the alignment marks formed in ALIGN step 100. The D-well regions serve as backgate and source of lateral DMOS power transistors, as the base and emitter of vertical NPN transistors such as the high frequency transistors of the present invention, and as the anode and cathode of zener diodes. The use of D-wells to form a base/emitter region for high frequency transistors is an alternative embodiment to using low-voltage p-tanks, as described in step 108.

At step 110, all tank/well dopants are diffused to nearly final depths by a high temperature operation. Typically, a temperature of 1100° C. for 500 minutes is used. This temperature is lower and the exposure duration is lower than the diffusion of step 103, so that the DUF region is not destroyed. As was discussed earlier, the tanks which are formed by this diffusion step as a result of the implants in steps 106–108 may extend through the thin epitaxial layer into the substrate due to the similarity of crystal structure in both the substrate and thin epitaxial layer. This step also essentially completes the diffusion of the initial high-voltage n-tanks and fuses the initial high voltage n-tanks and high voltage n-tank extensions into homogenous high voltage n-tanks.

At step 111, deep (p+) implantations are performed, for example, to form deep contacts to the back gates in the D-wells of for lateral DMOS n-channel power transistors. This step can be omitted if deep (p+) implantations are not needed. Step 111a is a deep (n+) implantation to form deep contacts to the DUF regions of high frequency transistors. This is often referred to as a deep collector.

At step 112, moat (isolating oxide regions surrounding active device areas) regions are defined with a mask. Channel stop implants that further isolate the devices from each other are carried out at step 113 in selected (p−) regions, with self-alignment to the active device areas. In step 114, the previously defined isolating regions have field oxide grown on the face of the semiconductor epitaxial layer.

Step 115 concerns growing a first gate oxide and the subsequent formation of a first-level polycrystalline silicon (poly 1) conductor. For example, floating gate avalanche injection "metal" oxide semiconductor (FAMOS) EPROM cell, double-level poly EEPROM cells, and poly—poly capacitors use first level polycrystalline silicon conductors.

Next, at step 116, the gate oxide for the control gates of the high-voltage and high power transistors is grown and threshold voltage $V_t$ adjust implants are performed for these transistors. The $V_t$ adjust forms a (p−) region at the surface of the DMOS transistors, self-aligned to active areas by the field oxide.

At step 118, similar low-voltage $V_t$ adjust implants are performed through the high-voltage gate oxide layer. For the low voltage transistors, the relatively thick high voltage gate oxide is removed and a thin gate oxide is thermally grown.

Step 120 concerns a portion of the EEPROM cell fabrication, and includes an (n+) Fowler-Nordheim tunnel diode implant and the formation of a thin tunnel oxide over the implant.

At step 122, a second-level polysilicon (POLY 2) layer is deposited, doped, patterned and etched to define gates for low- and high-voltage field effect transistors, single-level poly EEPROM cells, and to partially or completely define the control gate for FAMOS n-channel EPROM cells, double-level poly EEPROM cells and poly—poly capacitors.

At step 124, a patterning and etching of certain double-level poly gate stacks occurs to complete the definition of the FAMOS n-channel EPROM cell control gates and floating gates, and, in one embodiment, stack-etched EEPROM cells. EPROM (n+) cell implants can be done with the stack pattern.

In step 126, several source/drain implants and diffusions occur. The polysilicon transistor and memory cell gates have sidewall oxides formed adjacent their lateral edges and cap oxides on other exposed polysilicon surfaces. A lightly doped drain (LDD) (n) type implant is made into the surface source/drain regions of the n-channel field effect transistors immediately before a main (n+) source/drain implantation. The LDD and (n+) implantations are annealed, followed by (p+) source/drain patterning and implantation.

The n-type source/drain implantation step 126 is further used to form surface contact regions for back gates for p-channel transistors, and it may be used to form an emitter region in high frequency transistors in place of a D-well. The (p+) source/drain implantation step is further used to form surface contact regions for back gates for n-channel transistors, and base contact regions for npn bipolar transistors.

In step 128, the formation of the semiconductor portions of the fabricated devices is essentially complete and all that is left is the conductive interconnection of these devices with each other and to the outside world, with the exception of Schottky diode devices. An oxide is deposited in step 128 and is patterned and etched to produce contact windows.

At step 130, platinum is deposited and PtSi formed at contacts and Schottky diodes. Next, the first level of metal is deposited, patterned and etched. At step 132, a second-level of insulator is deposited over the first metal and vias are formed to the first metal. The second metal itself is deposited, patterned and etched at step 134. The sequence of depositing an insulator, forming vias, and forming metal interconnect can be continued as illustrated by steps 135 and 137. A protective overcoat is added at 136, and various post-clean room processes are performed on the chip at step 138.

FIGS. 2a–2k relate the inventive process to particular device types. Structures which have similar appearance in the drawings retain the same reference number. For example, the field oxide regions shown in each of the figures is labeled reference numeral 210. Structures formed in the same process step but having different appearances are given different reference numbers. For example, compare the gate 244 of device 146 to gate 242 of device 145 in FIG. 2k.

Table 1 provides a map by which process steps of FIG. 1 are related to FIGS. 2a–2k. For example, process step 103 forms an high-voltage n-tanks which are referred to as element 168 in device 141, 169 in device 145, etc, and are illustrated in 2a–2k.

Table 1

| Structure | Figure Number | Device | Ref. Number | Process Step |
|---|---|---|---|---|
| Thick Epitaxial Layer | 2a–2k | all | 152 | 101 |
| Initial High Voltage (n) Tank | 2a–2k | 141 | 168 | 102 |
| | | 145 | 169 | |
| | | 146 | 170 | |
| (n+) Buried Layer - DUF | 2b–2k | 147 | 154 | 104 |
| Thin Epitaxial Layer | 2b–2k | all | 156 | 105 |
| High Voltage (n) Tank Extension | 2b–2k | 141 | 168a | 102a |
| | | 145 | 169a | |
| | | 146 | 170a | |
| Low Voltage (n) Tank | 2b–2k | 139 | 175 | 106 |
| | | 144 | 176 | |
| | | 147 | 171 | |
| | | 148 | 177 | |
| High Voltage (p) Tank | 2c–2k | 142 | 182 | 107 |
| | | 143 | 184 | |
| | | 144 | 180 | |
| Low Voltage (p) Tank | 2d–2k | 140 | 190 | 108 |
| | | 145 | 192 | |
| | | 147 | 163 | |
| | | 149 | 186 | |
| D-well (prior to diffusion) | 2e–2k | 146 | 194 | 109 |
| (n+) Portion of the D-well | 2f–2k | 146 | 159 | 110 |
| (p-) Portion of the D-well | 2f–2k | 146 | 157 | 110 |
| Deep (p+) | 2g–2k | 146 | 200 | 111 |
| Deep (n+) | 2g–2k | 147 | 172 | 111a |
| Patterned Nitride Layer (moat definition) | 2h | all | 204 | 112 |
| Patterned Photoresist (channel stop def.) | 2h | all | 206 | 113 |
| Field Oxide | 2i–2k | all | 210 | 114 |
| Gate Oxide | 2i–2k | 149 | 212 | 115 |
| FAMOS gate | 2i–2k | 149 | 214 | 115 |
| Nitride/Oxide Layer | 2i–2k | 149 | 216 | 115 |
| HV Gate Oxide Layer | 2i–2k | 141 | 218 | 116 |
| | | 142 | | |
| | | 143 | | |
| | | 144 | | |

Table 1-continued

| Structure | Figure Number | Device | Ref. Number | Process Step |
|---|---|---|---|---|
| | | 145 | | |
| | | 146 | | |
| Gate Oxide Layer | 2i–2k | 139 | 220 | 118 |
| | | 140 | 220 | |
| (n-) Tunnel Region | 2i–2k | 143 | 224 | 120 |
| Tunnel Oxide | 2j–2k | 143 | 226 | 120 |
| Poly Gates | 2j–2k | 139 | 228 | 122 |
| | | 140 | 230 | |
| | | 141 | 232 | |
| | | 142 | 234 | |
| | | 143 | 236,238 | |
| | | 144 | 240 | |
| | | 145 | 242 | |
| | | 146 | 244 | |
| | | 149 | 248 | |
| EPROM Stack | 2k | 149 | 249 | 124 |
| LDD-Source/Drains (n+/n-) | 2k | 140 | 254,256 | 126 |
| | | 142 | 258,260 | |
| | | 143 | 262,264 | |
| | | 144 | 266,268 | |
| | | 146 | 272 | |
| | | 147 | 276 | |
| | | 149 | 280,282 | |
| Source/Drains (p+) | 2k | 139 | 284,286 | 126 |
| | | 141 | 288,290 | |
| | | 145 | 292,294 | |
| | | 146 | 272,274, 296 | |
| | | 147 | 298 | |
| | | 148 | 278 | |
| Sidewall insulator | 2k | all | 250 | 126 |
| Cap insulator | 2k | all | 252 | 126 |
| BPSG {borophosphosilcate glass}(only illustrated in device 148 but preferably used in all devices in all figures) | 2k | 148 | 300 | 128 |
| Orifice (only illustrated in device 148 but preferably used in all devices in all figures) | 2k | 148 | 302 | 128 |
| Contact (only illustrated in device 148 but preferably used in all devices in all figures) | 2k | 148 | 306 | 128 |
| Insulator | 2k | 148 | 304 | 128 |

FIGS. 2a–2k illustrate successive steps for forming several device types on a semiconductor substrate. A low-voltage p-channel field effect transistor 139, a low-voltage logic n-channel field effect transistor 140 (devices 139 and 140 being designed for voltages at or below about fourteen volts), a p-channel isolation or gating field-effect transistor 141 for an EEPROM array, an n-channel isolation or gating field-effect transistor 142 for an EEPROM array, electrically erasable programmable read-only memory Fowler-Nordheim tunneling cell 143, a drain-extended n-channel field effect transistor 144, a drain-extended p-channel field effect transistor 145, a lateral double-diffused "metal" oxide semiconductor (LDMOS) n-channel field effect transistor 146, a vertical npn bipolar high frequency transistor 147, a Schottky diode 148 and a floating gate avalanche metal oxide semiconductor (FAMOS) electrically programmable read-only memory (EPROM) cell 149 may all be formed on the same integrated circuit chip. Respective device areas and the devices themselves are denoted by common numbers throughout these drawings. Devices 141–147 and 149 are designed to be subjected to voltages and/or current densities much greater than the low-voltage logic transistors 139 and 140.

While the various devices formed during this integrated process flow are shown in FIGS. 2a–2k as being closely adjacent each other, this would not necessarily be the case in the finished semiconductor chip 22. The devices are shown in close association with each other only for the reader's convenience. The reader should understand that certain of the devices can (and most likely will) be separated by wide areas on the actual semiconductor chip 22. However, viewing the various devices in close association gives an understanding of the simultaneous application of each process step to each of the devices fabricated according to the process.

In the prior art, LDMOS transistors are built with D-well implants done after poly gate etching. This gives a source structure which has the channel length (defined by boron vs. arsenic diffusion) and the gate overlap of the channel defined by diffusion, hence a self-aligned source. The LDMOS transistor 146 fabricated in the sequence of FIGS. 2a–2k has the D-well defined and diffused prior to poly gate deposition, as described in U.S. Pat. No. 5,242,841. This advantageously puts the high temperature processing prior to MOS isolation formation, allowing VLSI density CMOS logic transistors to be built concurrently with the LDMOS power transistor.

LDMOS structure 146 of FIGS. 2a–2k has a double-diffused source 159 and backgate 157 giving a well controlled channel length. Gate overlap of the source depends on photoalignment, which is excellent for submicron class steppers. LDMOS transistor 146 has a (p–) region extending to the edge of the drain-side field oxide as a consequence of the blanket (unpatterned) (p–) implant used to adjust high voltage MOS threshold voltages. The (n) source/drain regions 272 and 274 are double diffused (n+/n–). Sidewall oxide 250 on the source side of poly gate 244 self aligns the heavily doped regions of source 274 to the gate.

Figure 2A:
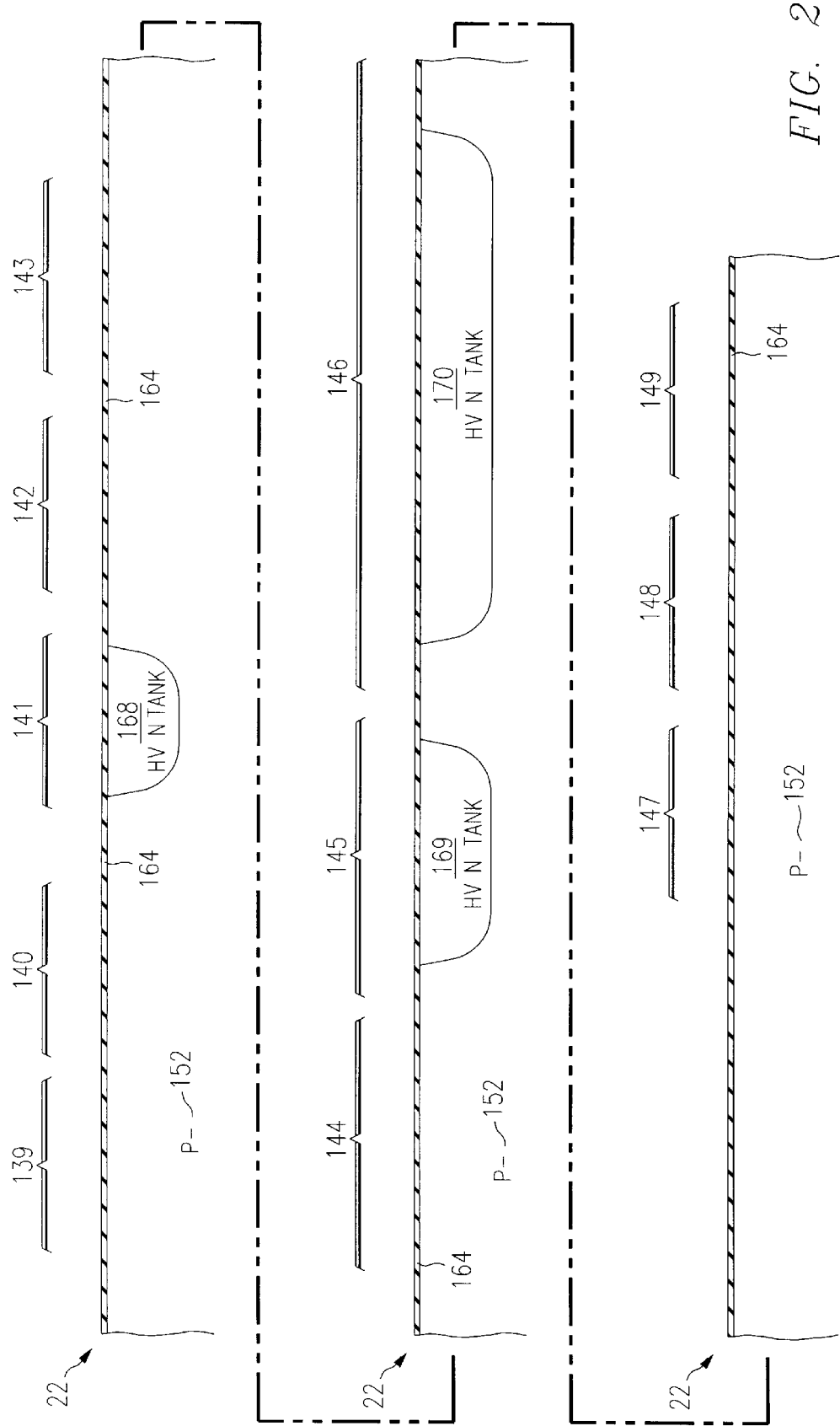
Figure 2B:
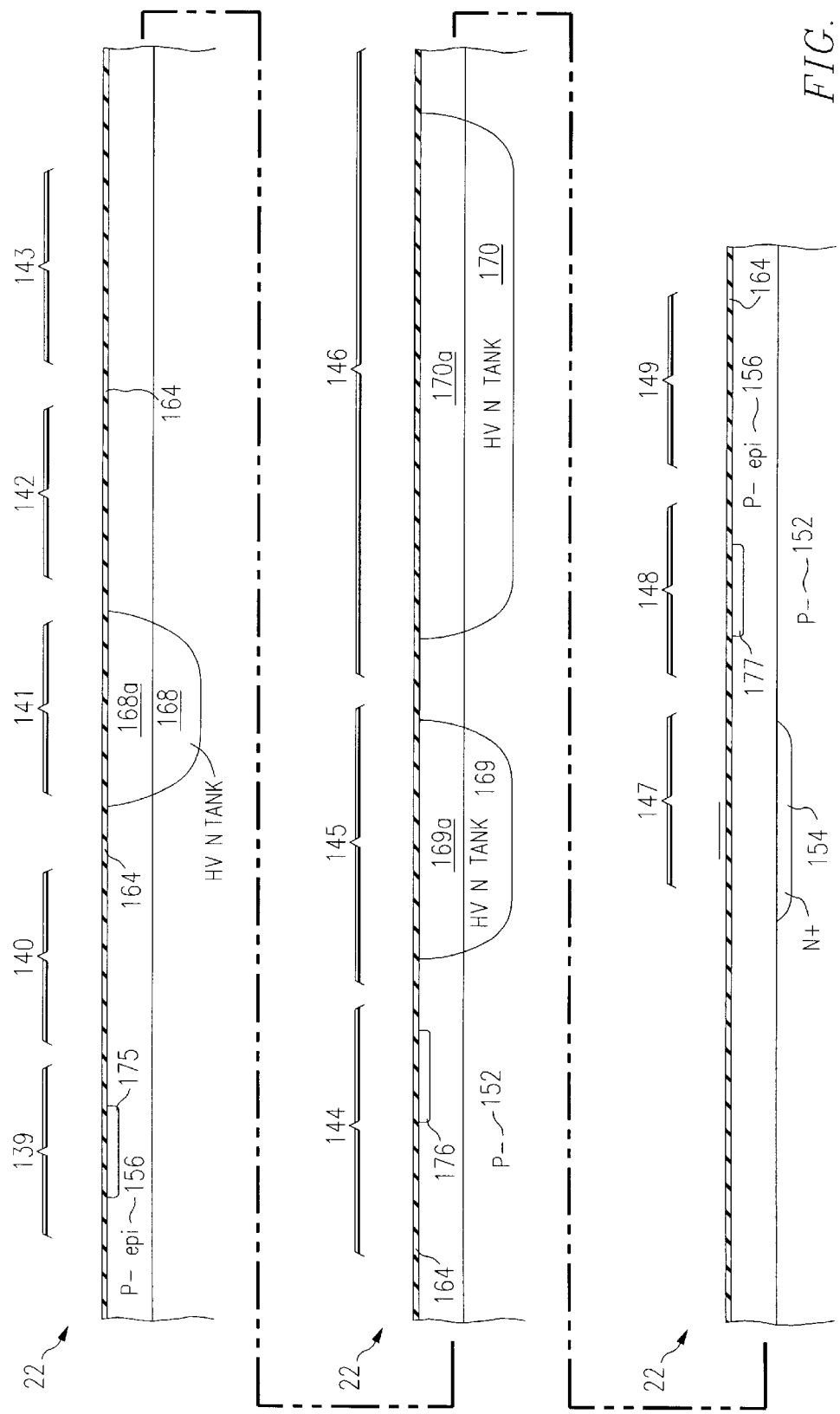
Figure 2C:
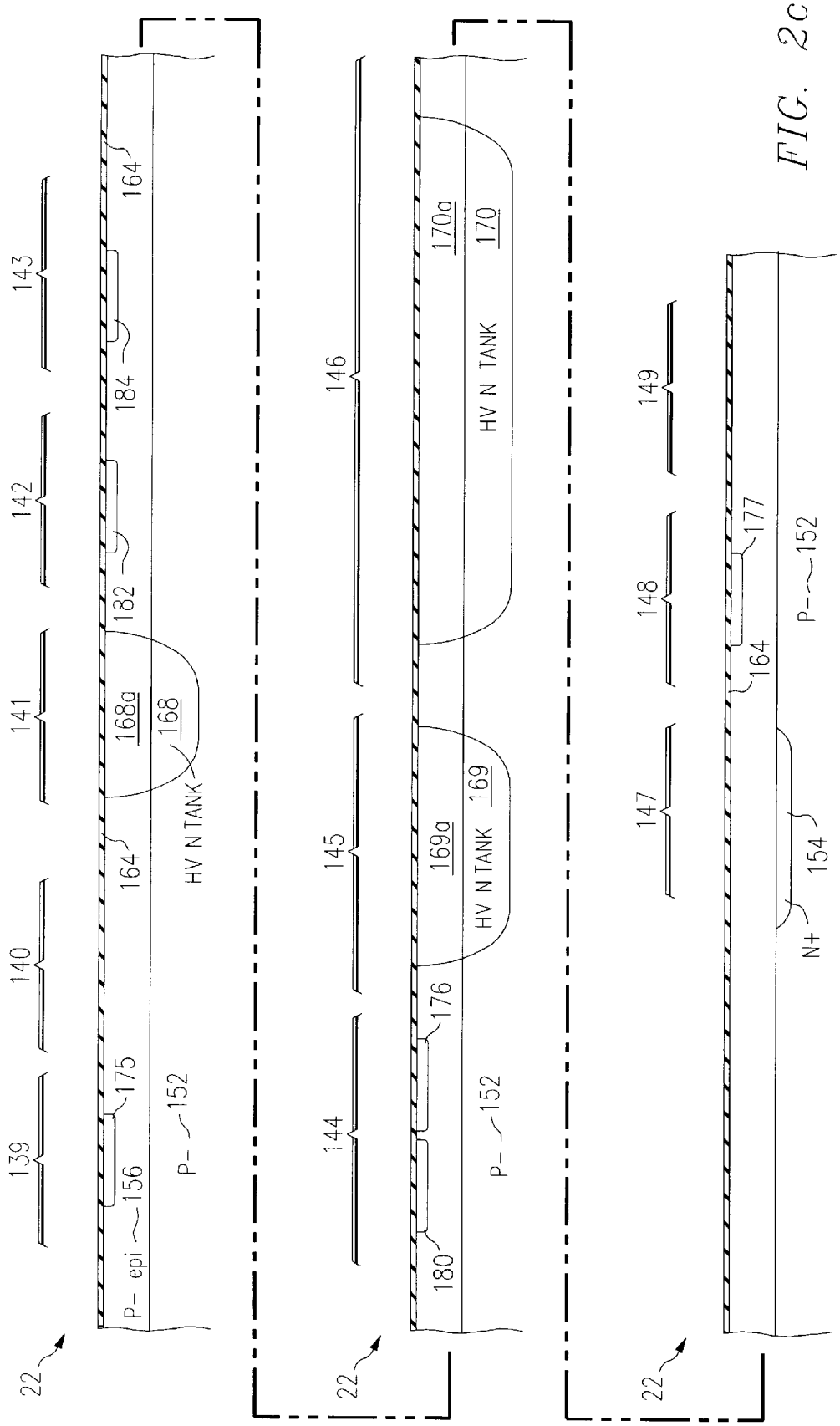
Figure 2D:
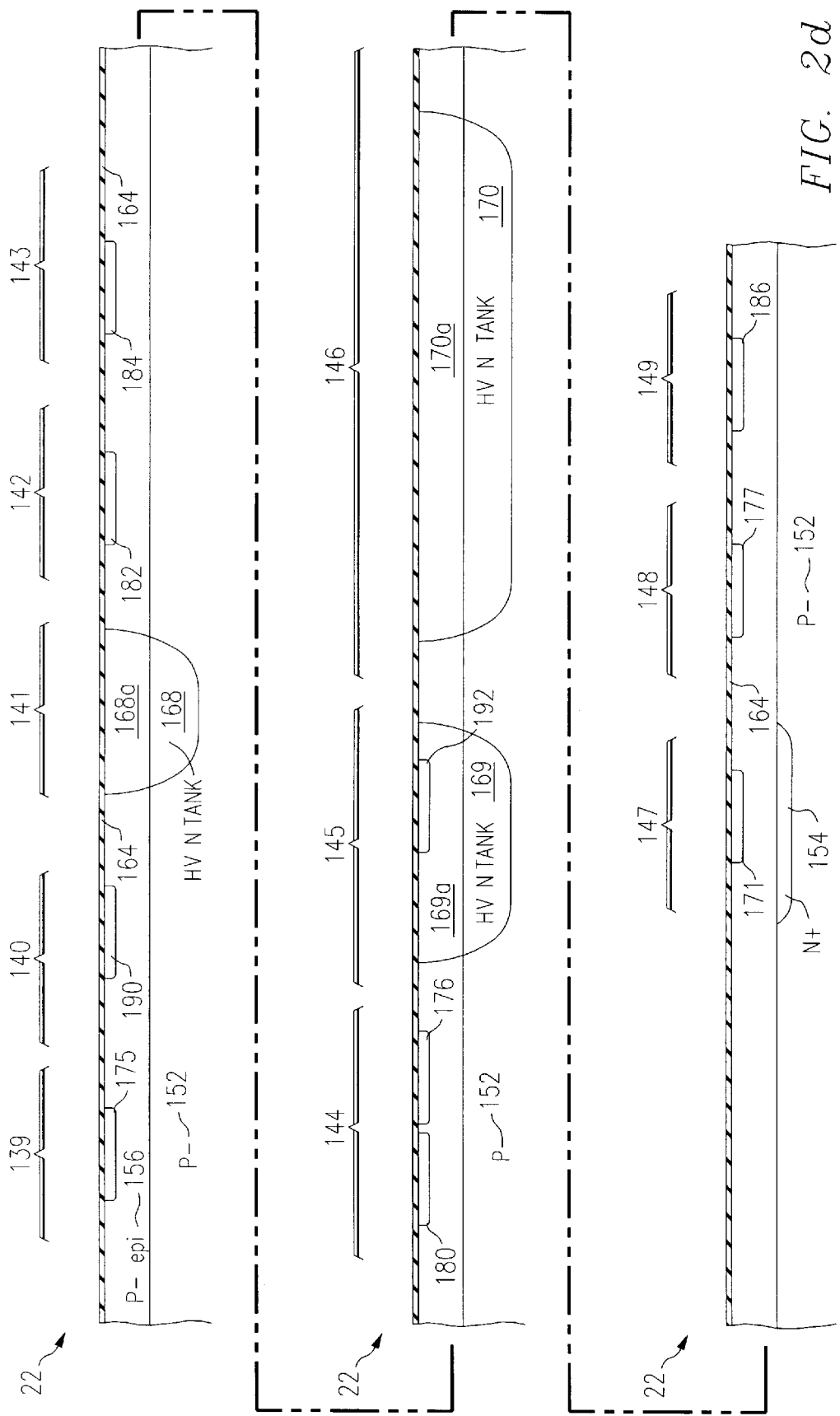
Figure 2E:
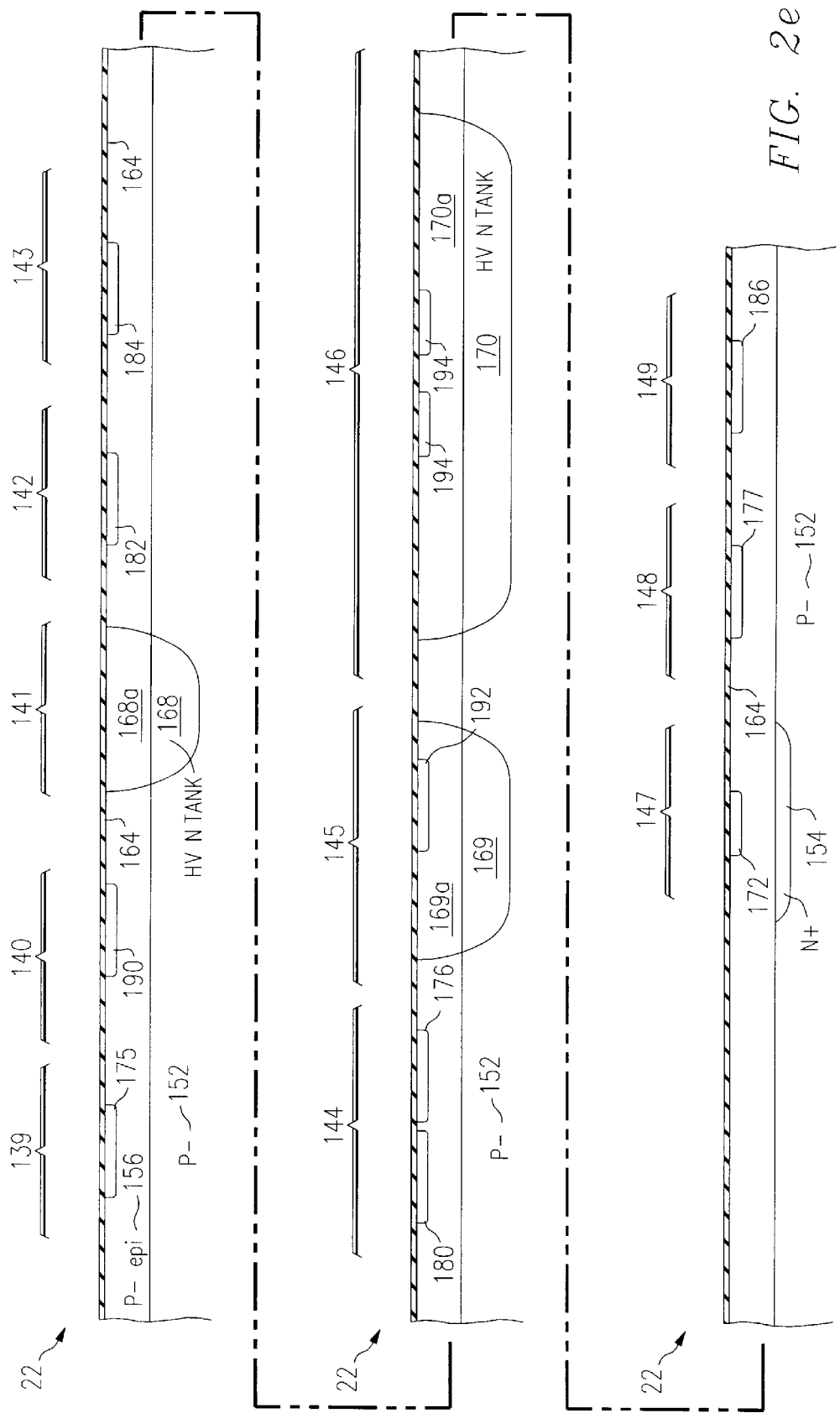
Figure 2F:
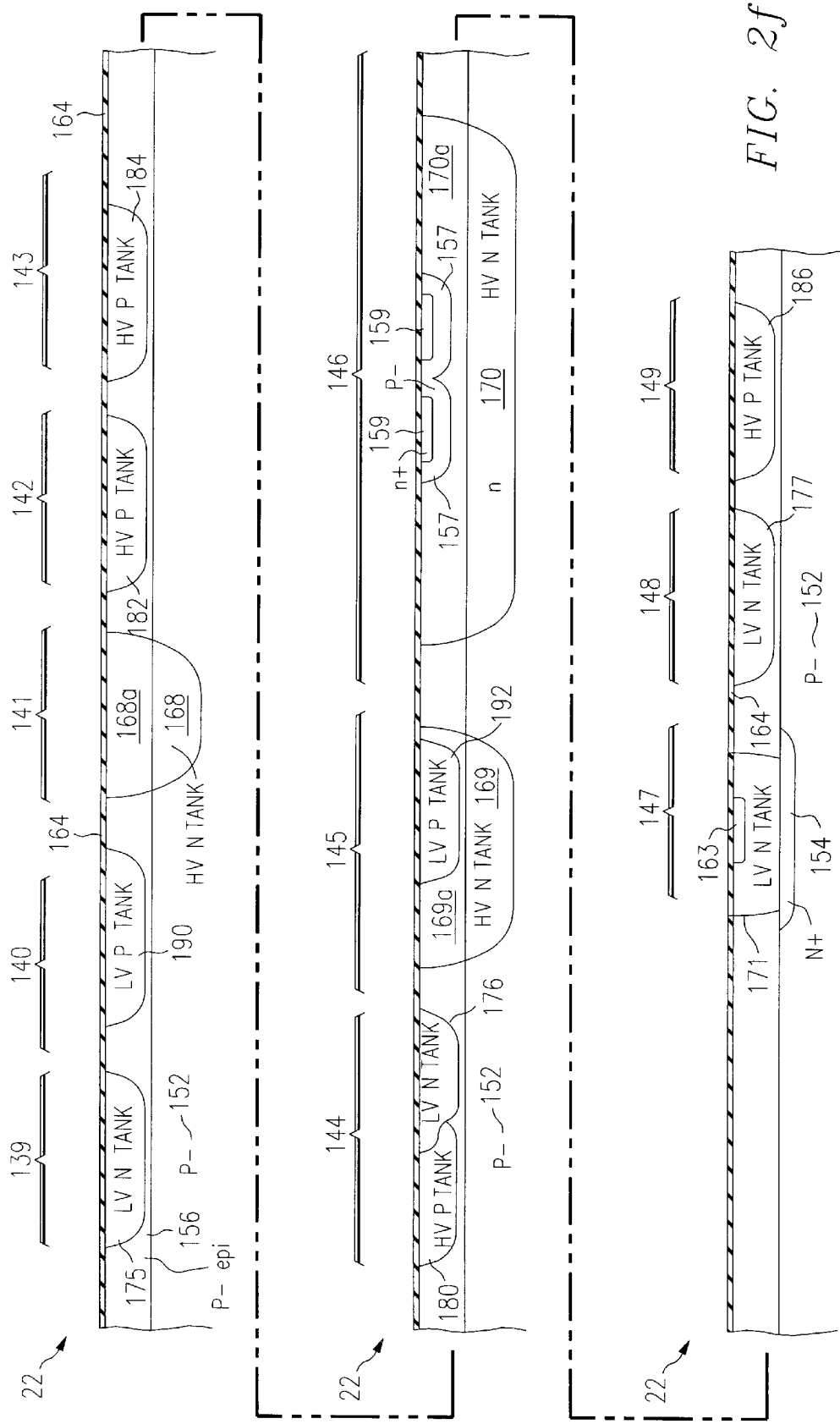
Figure 2H:
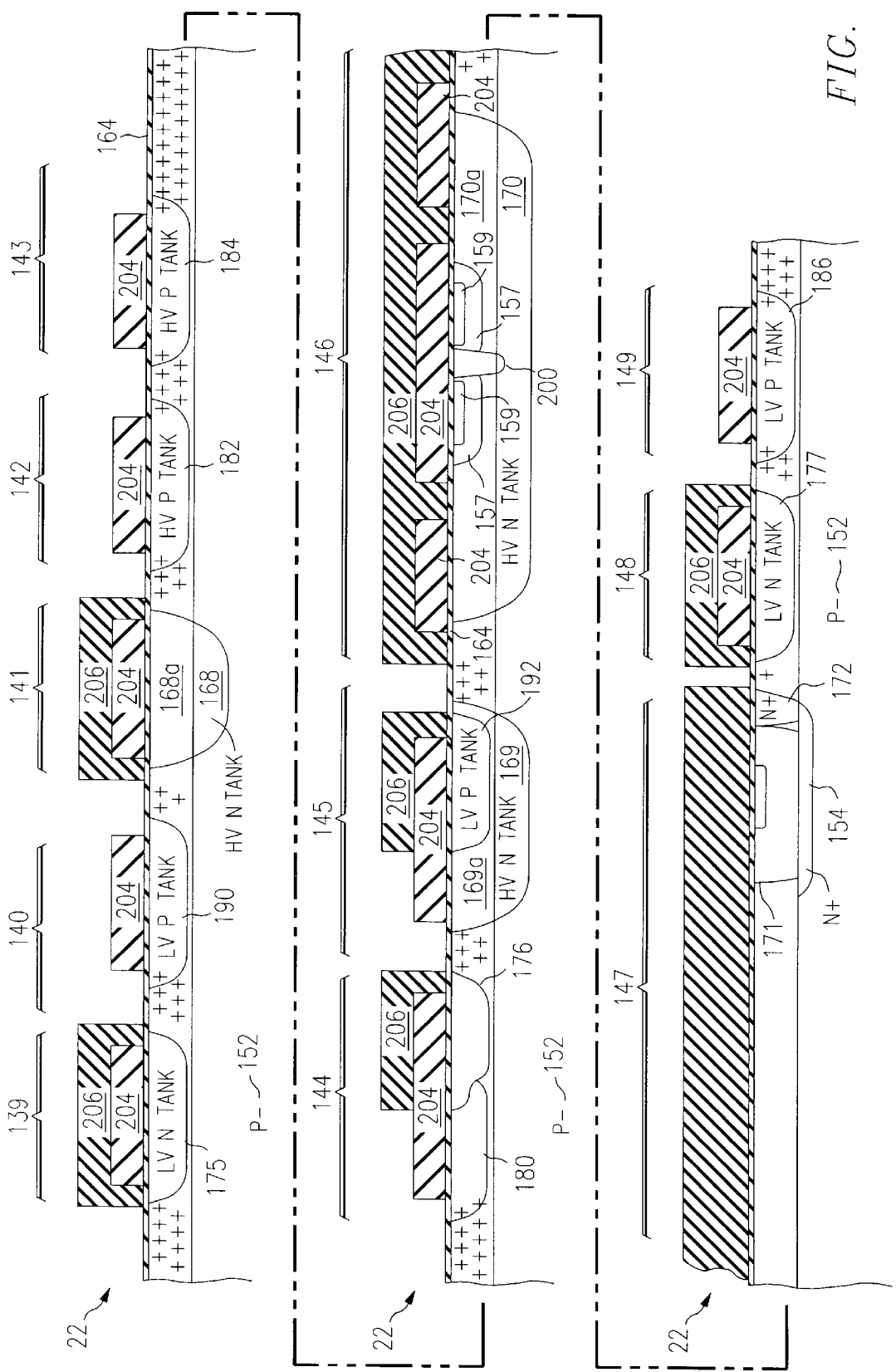
Figure 2I:
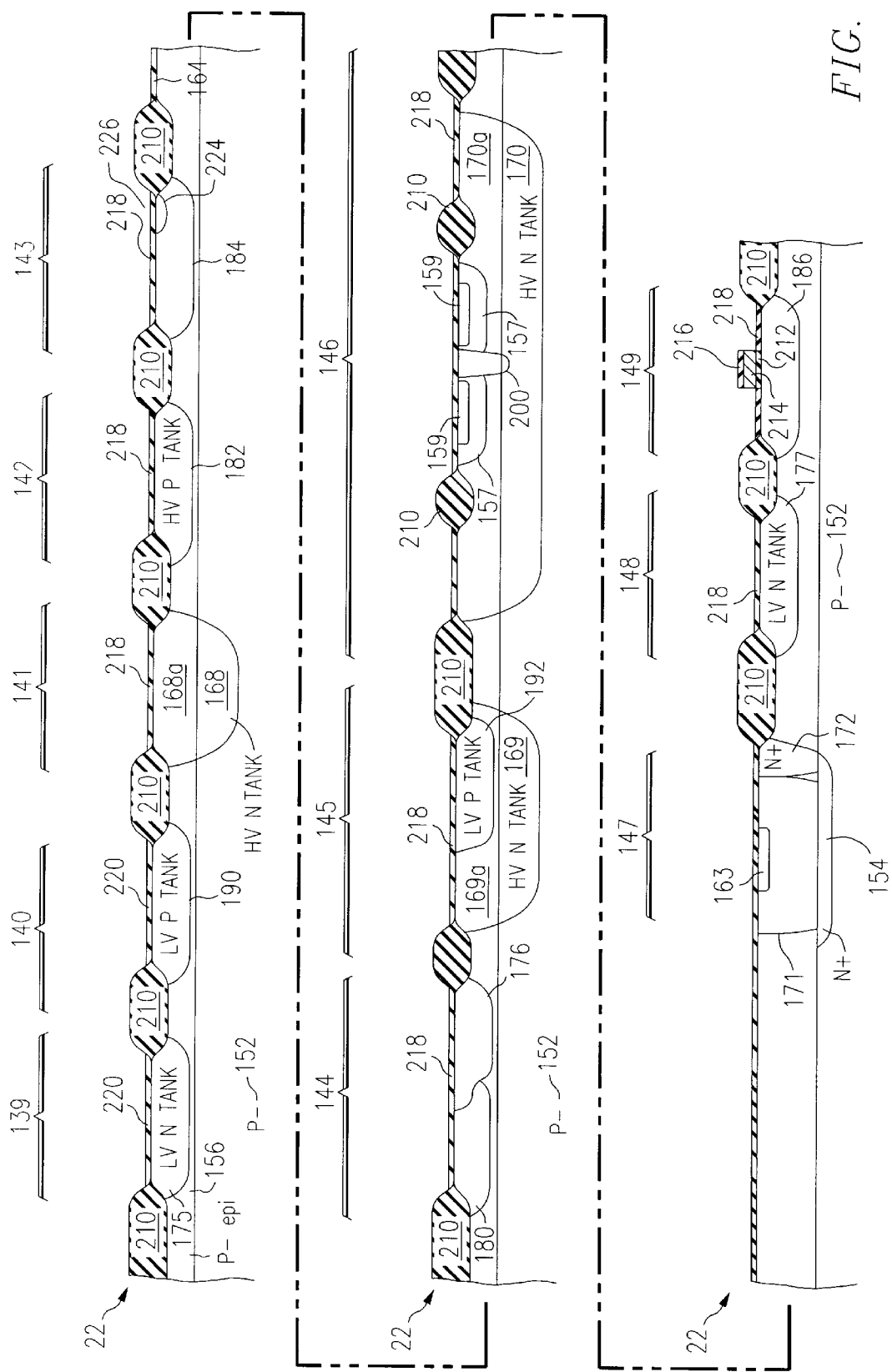
Figure 2K:
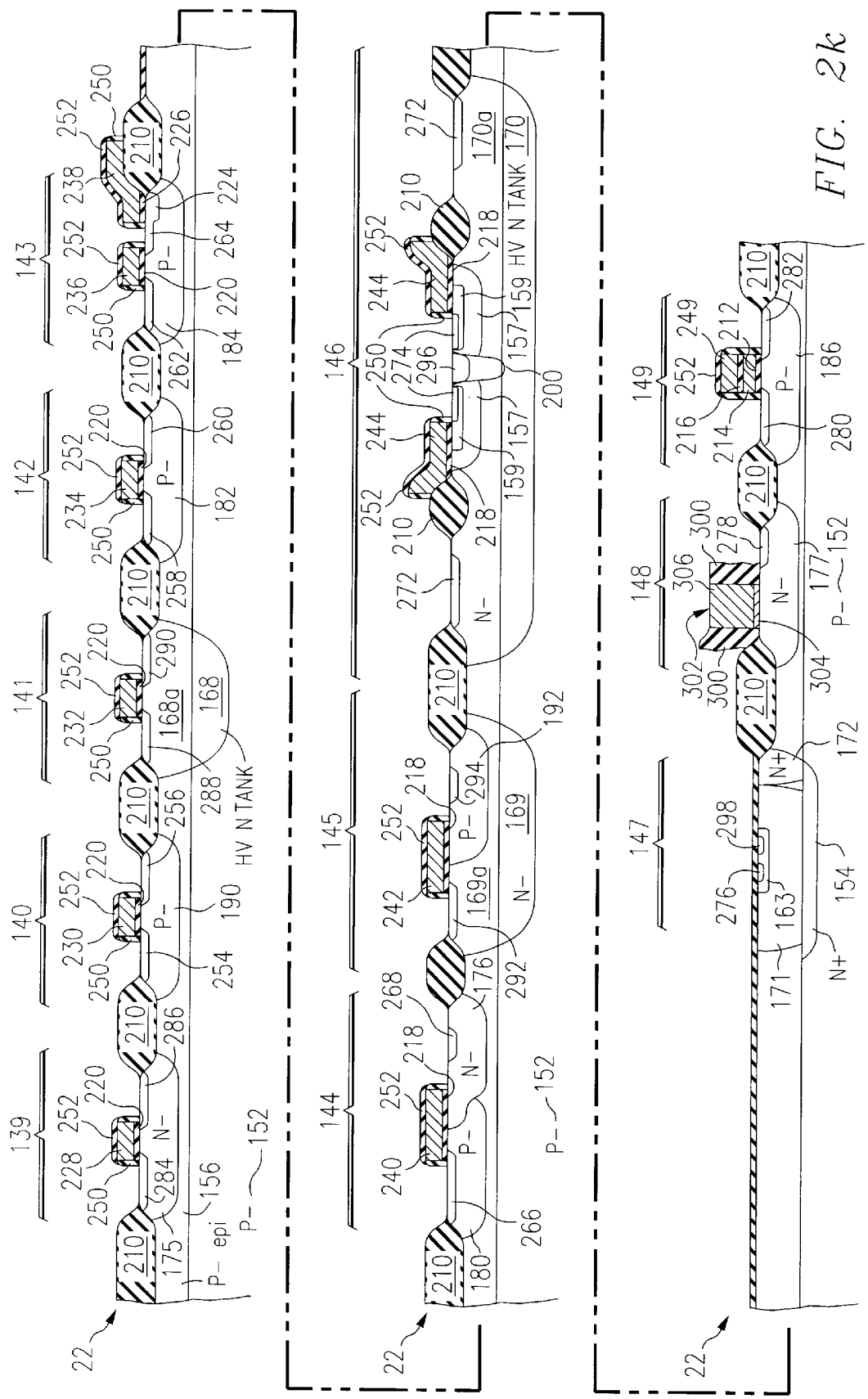

Vertical NPN transistor 147 is shown in detail in FIGS. 2k. Region 171 forms the collector. DUF 154 and deep n+ 172 form a low resistance connection to the buried portion of collector 171. This advantageously results in a low collector resistance which is essential for high frequency operation. Low voltage p-tank 163 forms a base region and n-type source/drain region 276 forms an emitter. P-type source/drain region 298 forms a contact to base region 163.

Transistors having a cutoff frequency of approximately 1 gigahertz can be formed in an epitaxial layer 156 which is approximately 1.5 micron (1500 nm) thick, while transistors having a cutoff frequency of 30–40 gigahertz may be formed in an epitaxial layer which is approximately 0.8–0.5 micron (800–500 nm) thick.

While power device 146 is described as being formed with a D-well, other types of power devices may be formed in a high voltage tank according to the present invention, such as photo-aligned LDMOS devices, twin well LDMOS devices, etc.

Figure 3A:
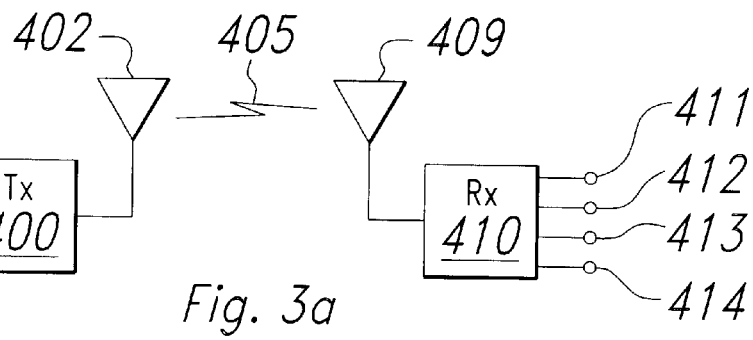
FIGS. 3a–3d are various aspects of a single chip communications receiver for controlling a servo or other type of device using high frequency devices and high power devices formed according to the present invention.

FIGS. 3a–3d describe a transmitter 400 and a receiver 410, each of which may be constructed in accordance with the present invention. In FIG. 3a, transmitter 400 may be constructed on a single integrated circuit which contains a keyboard interface or other user interface logic circuits, memory or EPROM or EEPROM circuits which retain command and control information, a processor for executing a program which may be stored in the EPROM or EEPROM, and a radio frequency modulator and transmitter for sending control information to a remote receiver. Transmitter 400 may use bipolar transistors formed according to the present invention to send a radio signal having a frequency of 390 megahertz, for example.

Figure 3B:
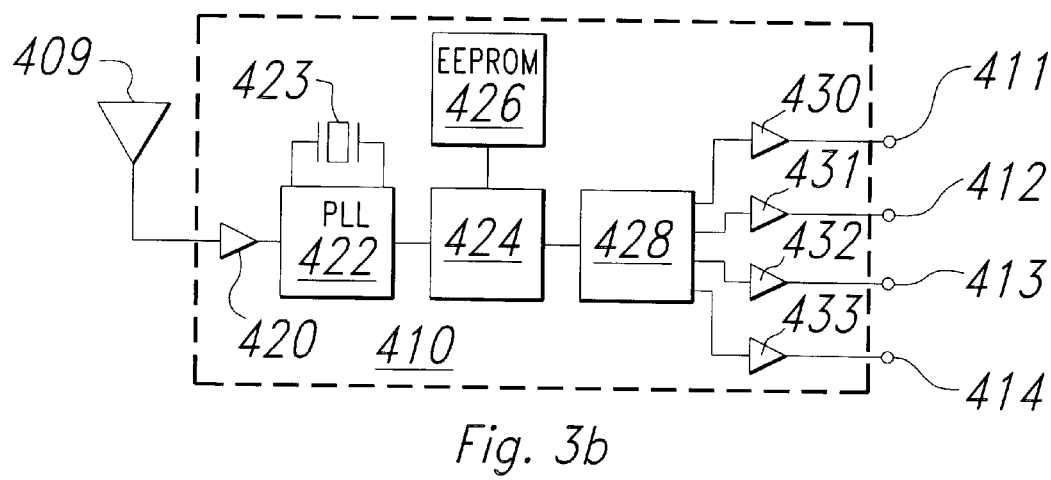

Receiver 410 is described in more detail in FIG. 3b. Antenna 412 collects radio frequency signals and introduces them to integrated circuit 410. Outputs from integrated circuit 410, of which signals 411–414 are representative, may be used to control servos, actuators, lamps, and other types of physical/electrical/mechanical devices. Receiver 420 receives the radio signal from the antennal, amplifies and decodes it using commonly known circuits with transistors formed according to the present invention. The radio signal may have a frequency of 390 megahertz, for example. Phase locked loop 422 is used to demodulate the signal so that a data stream imposed on the signal by a transmitter can be recovered. Processor 424 in combination with EEPROM 426 manipulates the data stream using a program stored in the EEPROM. The data stream has a format as shown in FIG. 3d and consists of packets having an identifier 450 and a command 452 and CRC protection fields 451 and 453.

The processor compares identifier 450 to a prestored value and does not act on a command unless a match occurs. If a match occurs, then the processor sends a command to control unit 428 which maintains the state of each controlled device and creates control signals which enable various high voltage output drivers, such as drivers 430–433, which are constructed according to the present invention. All of the devices are formed on a single integrated circuit according to the present invention.

Figure 3C:
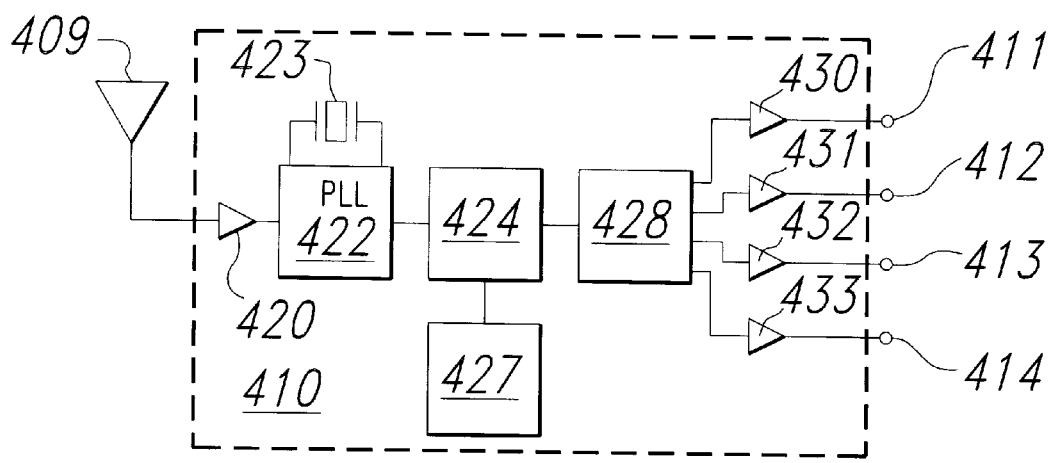
Figure 3D:
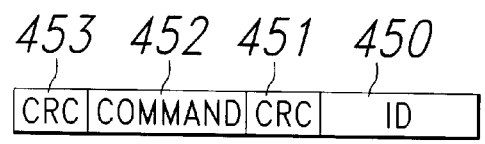

FIG. 3c describes an alternative embodiment in which EPROM 427 provides stored programs and identifier codes.

Figure 4A:
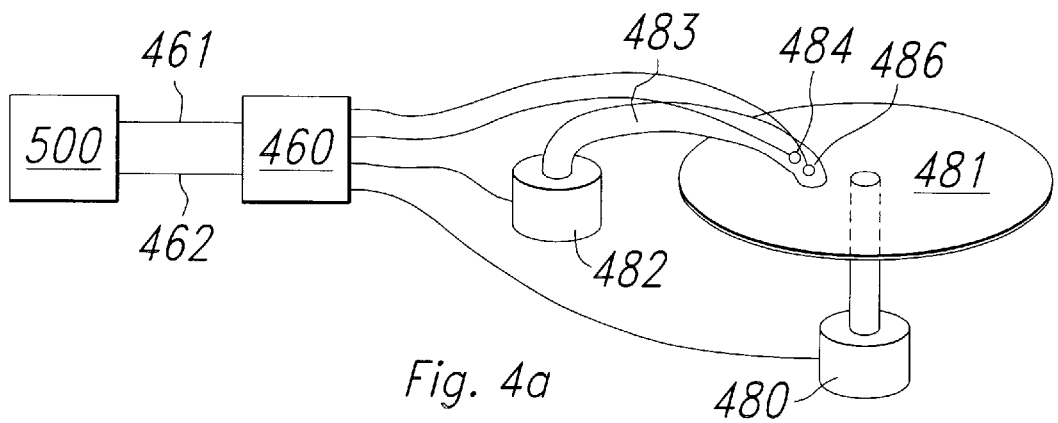
FIGS. 4a–4b are various aspects of a single chip disk controller using high frequency devices, an EEPROM device, and high power devices formed according to the present invention.
Figure 4B:
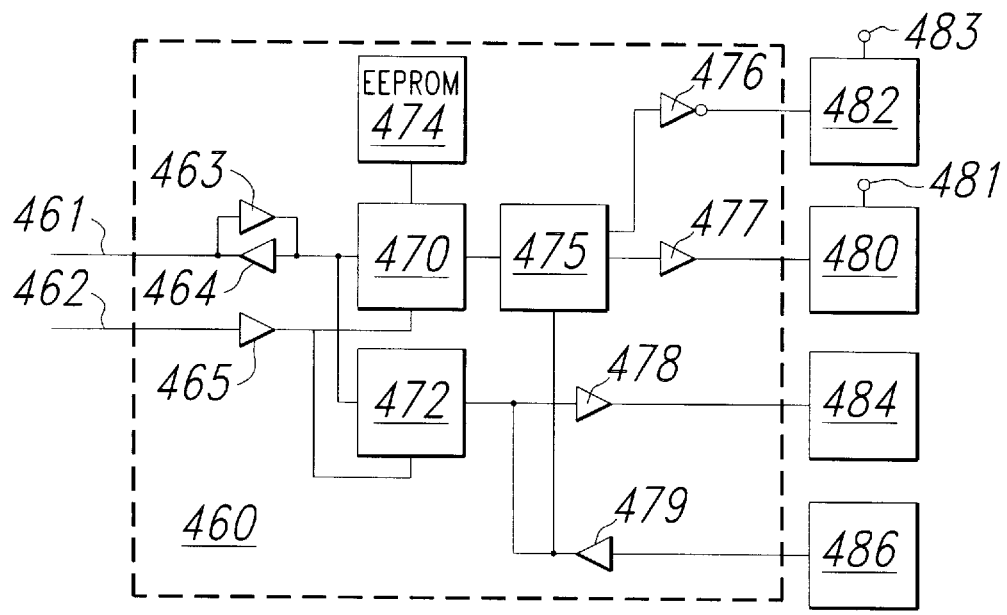

FIGS. 4a–4b illustrate a single chip disk controller 460 constructed according to the present invention. In FIG. 4a, data system 500 is a laptop computer, for example. Single Chip Controller 460 sends and receives data via data bus 461 and receives commands via command bus 462. Controller 460 provides signals to control a head servo 482, and a disk motor 480. Controller 460 also sends data to write head 484 to be written on disk platter 481. Controller 460 also retrieves data from the disk platter via read lead 486.

FIG. 4b illustrates single chip controller 460 in more detail. Receivers 463 and 465 and drivers 464 comply with the Small Computer System Interface, SCSI, voltage levels. Processor 470 responds to SCSI commands by executing programs stored in EEPROM 474. The processor directs the movement of blocks of data through storage buffer 472 which provides buffer for read and write data in FIFO buffers having storage capacities of 64 kbytes. Control logic 475 maintains the state of the motor and head servo and controls head tracking using the read head signal. Output devices 476 and 477 provide high current signals to quickly move the head and power signals to operate the motor. Drivers 478 and receivers 479 send and receive microvolt high frequency signals for the read and write heads. All of the devices in the single chip controller are fabricated on a single integrated circuit according to the present invention.

An advantage of the present invention is that many types of systems which require control of physical devices, high frequency functions, storage functions and other digital processing functions can be formed on a single integrated circuit.

Another advantage of the present invention is that bipolar devices having cutoff frequencies higher than one gigahertz can be fabricated on the same chip in combination with many other types of devices, for example: a low-voltage p-channel field effect transistor, a low-voltage logic n-channel field effect transistor, a p-channel isolation or gating field-effect transistor for an EEPROM array, an n-channel isolation or gating field-effect transistor for an EEPROM array, electrically erasable programmable read-only memory Fowler-Nordheim tunneling cell, a drain-extended n-channel field effect transistor, a drain-extended p-channel field effect transistor, a lateral double-diffused "metal" oxide semiconductor (LDMOS) n-channel field effect transistor, or a Schottky diode and a floating gate avalanche metal oxide semiconductor (FAMOS) electrically programmable read-only memory (EPROM) cell.

Another advantage of the present invention is that the high frequency characteristics of the bipolar transistor can be optimized without disturbing the process low for forming the other types of devices. Vertical NPN bipolar transistors, lateral PNP bipolar transistors, and Schotky diodes can be advantageously formed in a thin epitaxial layer in combination with a DUF region. The frequency characteristics of these devices may be optimized by controlling the thickness of the epitaxial layer.

Another advantage of the present invention is that other types of devices may be formed on the same without regard to the presence of the thin epitaxial layer since the crystal structure of the eptiaxial layer matches the crystal structure of the substrate.

Another advantage of the present invention is that an in-place common core logic process can be optimized to form good bipolar devices in addition to good power devices.

Another advantage of the current invention is that systems which heretofore required multiple integrated circuits can be formed on a single integrated circuit with resulting savings in cost and space.

While the invention has been described with reference to illustrative embodiments, this description is not intended to be construed in a limiting sense. Various other embodiments will be apparent to persons skilled in the art upon reference to this description. It is therefore contemplated that the appended claims will cover any such modifications of the embodiments as fall within the true scope and spirit of the invention.

What is claimed is:

1. A method of fabricating a high voltage MOS device and a high frequency bipolar device in a semiconductor substrate, said method comprising the steps of:
   introducing a dopant of a second conductivity type into said substrate having a first conductivity type;
   diffusing said dopant to form an initial high-voltage tank;
   forming a thin epitaxial layer on an upper surface of said substrate such that said thin epitaxial layer overlies said tank, said epitaxial layer having the same conductivity type as said substrate;
   forming a high voltage tank extension by introducing a dopant of said second conductivity type into said epitaxial layer in a region directly above said initial high-voltage tank;
   forming a homogeneous high-voltage tank comprising said initial high-voltage tank and said high voltage tank extension by diffusing said tank extension, such that said homogeneous high voltage tank extends through said epitaxial layer and has an approximately uniform dopant distribution; and
   forming said high voltage MOS device in said homogeneous high voltage tank.

2. The method of claim 1, further comprising:
   introducing a dopant of said second conductivity type into said substrate to form a Diffusion Under Film, DUF, region of good conductivity such that said DUF region is between said substrate and said thin epitaxial layer; and
   forming said high frequency bipolar device in said thin epitaxial layer in conjunction with said DUF region, in a manner that the high frequency characteristics of said bipolar device are enhanced by the thinness of said thin epitaxial layer.

3. The method of claim 1, wherein the step of forming a high voltage MOS device further comprises:
   introducing dopants of said first conductivity type and said second conductivity type in a region in said homogeneous high-voltage tank;
   diffusing said dopants of said first and said second conductivity type to form a second region within a third region, both within said homogeneous high-voltage tank, due to the different rates of diffusion of said dopants;
   forming a gate structure which overlaps said third region;
   forming a thick field oxide in said homogeneous high voltage tank; and
   forming a drain region in said homogeneous high voltage tank adjacent to said thick field oxide.

4. The method of claim 2, wherein the step of forming a high frequency device further comprises:
   introducing a dopant of said second conductivity type into said thin epitaxial layer to form a collector region that extends through said thin epitaxial layer and connects to said DUF region;
   forming an emitter region and a base region in said collector region; and
   forming a contact region of good conductivity through said thin epitaxial layer, said contact region connecting to said DUF.

5. The method of claim 1, wherein said first conductivity type is p-type.

6. The method of claim 5, wherein said second conductivity type is n-type.

7. The method of claim 6, wherein the introduction of dopants occurs by implanting an n-type dopant and a p-type dopant.

8. The method of claim 1, wherein said thin epitaxial layer is less than approximately 1.75 microns thick.

9. The method of claim 2, in which said high frequency bipolar transistor has an operating frequency that is greater than about 1 gigahertz.

10. The method of claim 1, in which said high voltage MOS transistor operates in a voltage range that is selected to be between approximately 30 volts to 60 volts.

11. The method of claim 2, further comprising:
    forming a third device in said thin epitaxial layer, said third device type is selected from the group consisting of:
    a) a sub micron CMOS device,
    b) an EEPROM device,
    c) an EPROM device,
    d) a high voltage CMOS device,
    e) a tunneling diode, and
    f) a Schottky diode.

12. The method of claim 1 wherein the step of forming a thin epitaxial layer forms a thin epitaxial layer having approximately a same crystal orientation and impurity concentration as said substrate.

13. A method of fabricating an integrated circuit, comprising the steps of:
    forming an initial high-voltage tank in a semiconductive substrate;
    forming a thin epitaxial layer on top of said substrate and overlying said initial high-voltage tank, said epitaxial layer having approximately a same crystal orientation and impurity concentration as said substrate, wherein said substrate has a first conductivity type, said epitaxial layer has said first conductivity type, said initial high voltage tank has a second conductivity type;

forming a tank extension having said second conductivity type in said epitaxial layer directly above said initial high voltage tank and in contact with said initial high voltage tank, so that a homogeneous high voltage tank is formed;

forming a high frequency bipolar transistor, having an emitter, a base, and a collector in said thin epitaxial layer;

forming a high voltage MOS transistor in said homogeneous high-voltage tank;

wherein the step of forming a high voltage MOS transistor further comprises the steps of:

forming a D-well in said homogenous high voltage tank, said D-well having a backgate region of said first conductivity type and a source region formed within said backgate region of said second conductivity type;

forming a gate structure above a portion of said D-well and overlying said backgate region, said gate structure comprising a conductive gate and a gate insulation layer between said gate and said D-well;

forming a thick field oxide in said homogenous high voltage tank; and forming a drain region of said second conductivity type in said homogenous high voltage tank, said thick field oxide being interposed between said drain region and said gate structure.

14. The method of claim 13, in which the step of forming a thin epitaxial layer forms a thin epitaxial layer which is less than approximately 1.75 microns thick.

15. The method of claim 13, in which said high frequency bipolar transistor has an operating frequency that is greater than about 1 gigahertz.

16. The method of claim 13, comprising the steps of:

forming a Diffusion Under Film, DUF, region in said substrate adjacent to said epitaxial layer, said DUF region being directly below said high frequency transistor and connected to said collector; and forming means for contacting said DUF region so that an electrical path having a low impedance is formed from said collector to an upper surface of said epitaxial layer.

17. The method of claim 16, wherein the step of forming a high frequency bipolar transistor further comprises the steps of:

forming a region of said second conductivity type for said collector in said epitaxial layer such that said collector region overlies said DUF region and is in contact with said DUF region;

forming said base of said first conductivity type within said collector region; and forming said emitter of said second conductivity type within said base region.

18. The method of claim 13, in which the step of forming a high voltage MOS transistor forms said high voltage MOS transistor which operates in a voltage range that is selected to be between approximately 30 volts to 60 volts.

19. The method of claim 13, further comprising the step of forming a third device in said epitaxial layer, said third device type is selected from the group consisting of:

a) a sub micron CMOS device, b) an EEPROM device, c) an EPROM device, d) a high voltage CMOS device, e) a tunneling diode, and f) a Schottky diode.

* * * * *